United States Patent
Keng et al.

(10) Patent No.: US 10,658,242 B2
(45) Date of Patent: May 19, 2020

(54) STRUCTURE AND FORMATION METHOD OF SEMICONDUCTOR DEVICE WITH FIN STRUCTURES

(71) Applicant: Taiwan Semiconductor Manufacturing Co., Ltd., Hsinchu (TW)

(72) Inventors: Wen-Chun Keng, Hsinchu County (TW); Yu-Kuan Lin, Taipei (TW); Chang-Ta Yang, Hsinchu (TW); Ping-Wei Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/047,121

(22) Filed: Jul. 27, 2018

(65) Prior Publication Data

US 2019/0157155 A1 May 23, 2019

Related U.S. Application Data

(60) Provisional application No. 62/589,081, filed on Nov. 21, 2017.

(51) Int. Cl.
*H01L 21/8234* (2006.01)
*H01L 27/088* (2006.01)
(Continued)

(52) U.S. Cl.
CPC ........ *H01L 21/823418* (2013.01); *H01L 21/823431* (2013.01); *H01L 21/823468* (2013.01);
(Continued)

(58) Field of Classification Search
CPC ..... H01L 21/823418; H01L 21/823431; H01L 21/823468; H01L 21/3065;
(Continued)

(56) References Cited

U.S. PATENT DOCUMENTS

2015/0303118 A1* 10/2015 Wang .............. H01L 21/823481
257/401
2017/0207126 A1* 7/2017 Ching ............. H01L 21/823431
(Continued)

*Primary Examiner* — Tong-Ho Kim
(74) *Attorney, Agent, or Firm* — Birch, Stewart, Kolasch & Birch, LLP

(57) ABSTRACT

A structure and a method of a semiconductor device structure are provided. The method includes forming a first fin structure, a second fin structure, and a third fin structure over a semiconductor substrate. The method includes forming first spacer elements over sidewalls of the first fin structure and the second fin structure and partially removing the first fin structure and the second fin structure. The method includes forming second spacer elements over sidewalls of the third fin structure and partially removing the third fin structure. The second spacer element is taller than the first spacer element. The method includes epitaxially growing a semiconductor material over the first fin structure, the second fin structure, and the third fin structure such that a merged semiconductor element is formed on the first fin structure and the second fin structure, and an isolated semiconductor element is formed on the third fin structure.

20 Claims, 11 Drawing Sheets

(51) Int. Cl.
*H01L 29/08* (2006.01)
*H01L 21/311* (2006.01)
*H01L 21/3065* (2006.01)

(52) U.S. Cl.
CPC ...... *H01L 27/0886* (2013.01); *H01L 21/3065* (2013.01); *H01L 21/31116* (2013.01); *H01L 21/31144* (2013.01); *H01L 29/0847* (2013.01)

(58) Field of Classification Search
CPC ......... H01L 21/31116; H01L 21/31144; H01L 27/0886; H01L 29/0847
USPC ....................................................... 257/401
See application file for complete search history.

(56) References Cited

U.S. PATENT DOCUMENTS

2017/0221892 A1* 8/2017 Li ......................... H01L 21/324
2017/0243868 A1* 8/2017 Lee .................. H01L 21/30604

* cited by examiner

US 10,658,242 B2

STRUCTURE AND FORMATION METHOD OF SEMICONDUCTOR DEVICE WITH FIN STRUCTURES

PRIORITY CLAIM AND CROSS-REFERENCE

This Application claims the benefit of U.S. Provisional Application No. 62/589,081, filed on Nov. 21, 2017, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
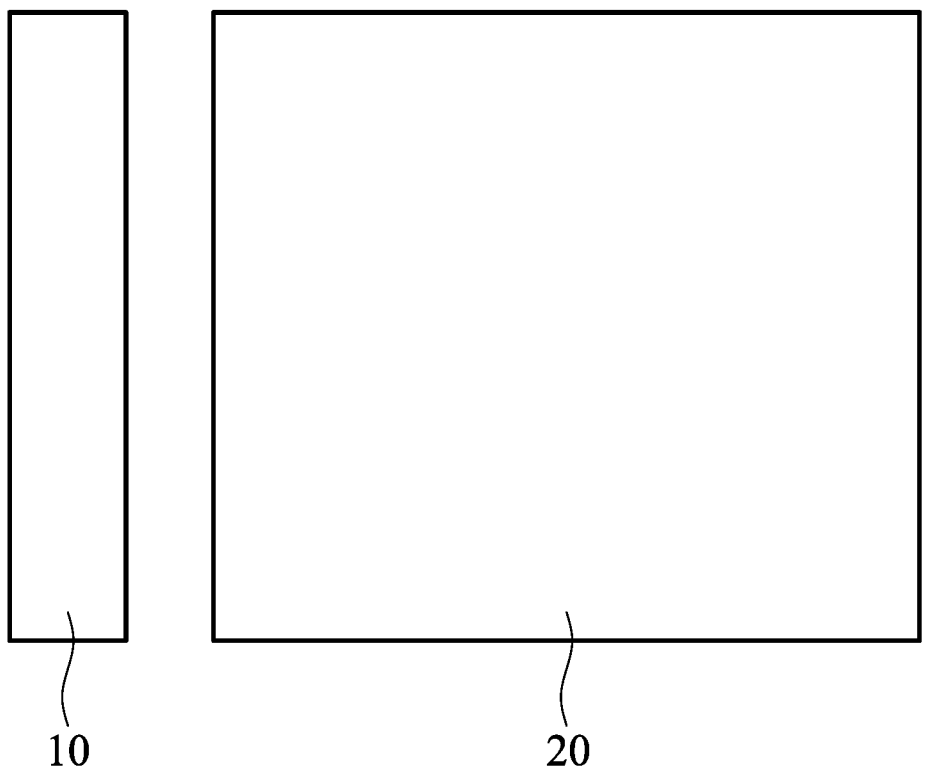
FIG. 1 is a top view of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure may relate to FinFET structure having fins. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

FIG. 1 is a top view of a semiconductor device structure, in accordance with some embodiments. In some embodiments, the semiconductor device structure includes a first region 10 and a second region 20. The second region 20 may be a cell region that includes multiple memory devices. In some embodiments, the second region 20 includes multiple static random-access memory (SRAM) devices. The first region 10 may be a pickup region that includes multiple devices. These devices may be in electrical communication with the memory devices in the second region 20. The first region 10 and the second region 20 may each include multiple fin field-effect transistors (FinFETs).

Figure 2:
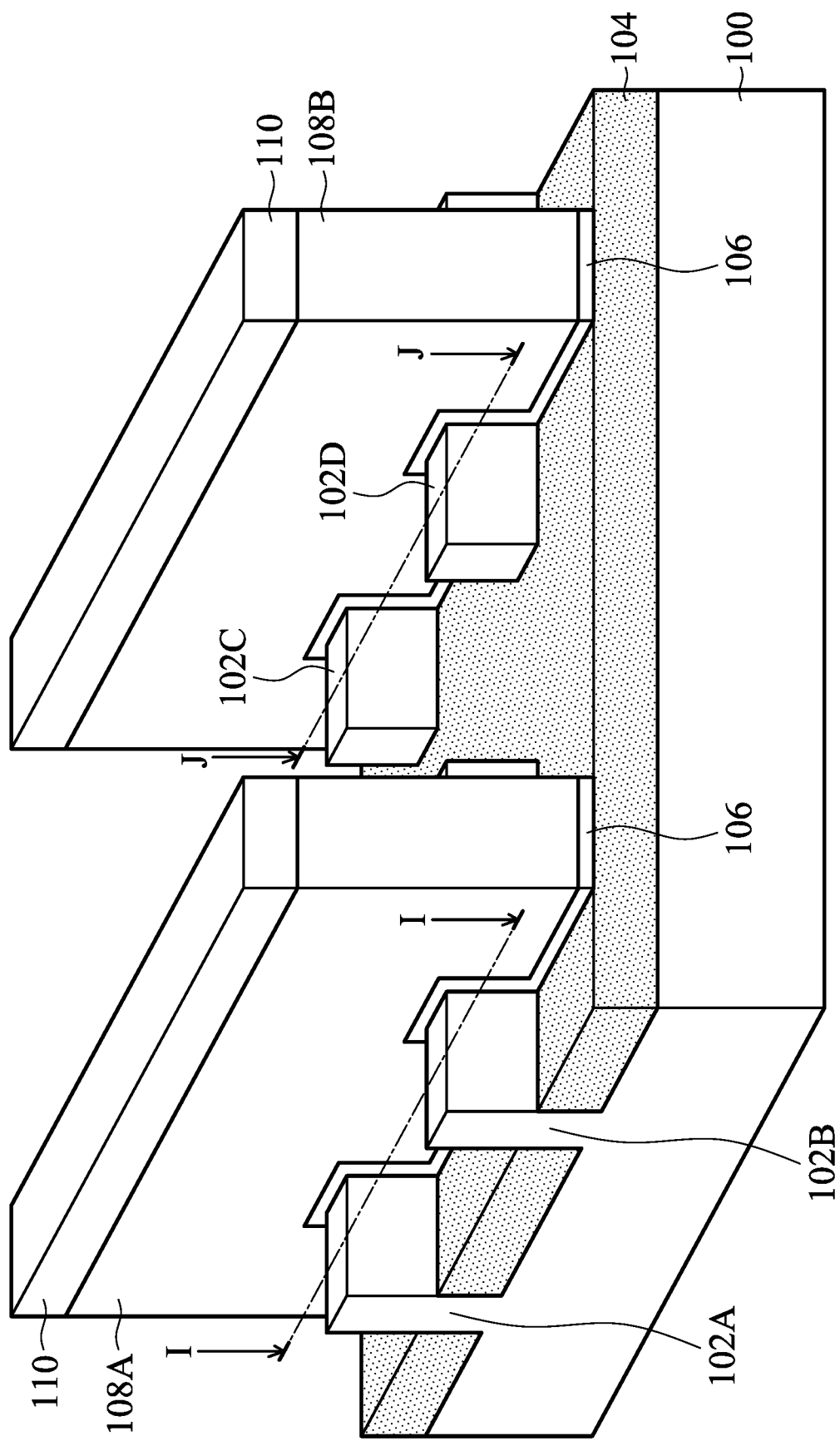
FIG. 2 is a perspective view of a stage of a process for forming a semiconductor device structure, in accordance with some embodiments.

FIG. 2 is a perspective view of a stage of a process for forming a semiconductor device structure, in accordance with some embodiments. In some embodiments, FIG. 2 shows one of the FinFETs in the first region 10 and one of the FinFETs in the second region.

Figure 3A:
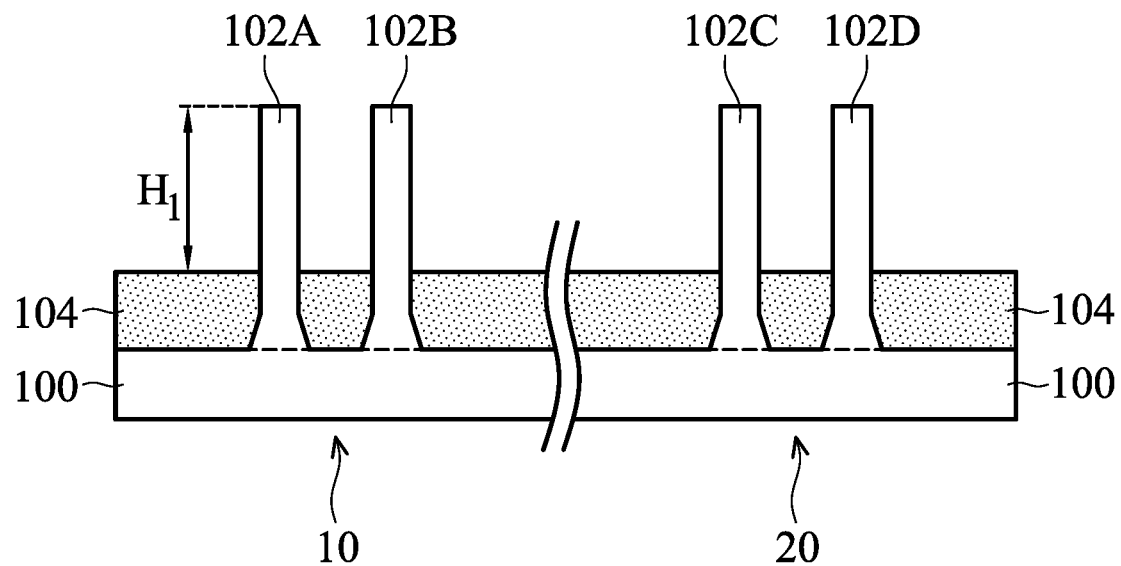
FIGS. 3A-3J are cross-sectional views of various stages of a process for forming a semiconductor device structure, in accordance with some embodiments.

FIGS. 3A-3J are cross-sectional views of various stages of a process for forming a semiconductor device structure, in accordance with some embodiments. As shown in FIG. 3A, a semiconductor substrate 100 is received or provided.

Portions of the first region 10 and the second region 20 are shown. In some embodiments, the first region 10 shown in FIG. 3A corresponds to a cross-sectional view taken along the line I-I of FIG. 2, and the second region 20 shown in FIG. 3A corresponds to a cross-sectional view taken along the line J-J of FIG. 2.

In some embodiments, the semiconductor substrate 100 is a bulk semiconductor substrate, such as a semiconductor wafer. For example, the semiconductor substrate 100 includes silicon or other elementary semiconductor materials such as germanium. The semiconductor substrate 100 may be un-doped or doped (e.g., p-type, n-type, or a combination thereof). In some other embodiments, the semiconductor substrate 100 includes a compound semiconductor. The compound semiconductor may include silicon carbide, gallium arsenide, indium arsenide, indium phosphide, one or more other suitable compound semiconductors, or a combination thereof. In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

As shown in FIG. 3A and FIG. 2, multiple recesses (or trenches) are formed in the semiconductor substrate 100, in accordance with some embodiments. As a result, multiple fin structures including fin structures 102A, 102B, 102C, and 102D are formed or defined between the recesses. In some embodiments, one or more photolithography and etching processes are used to form the recesses. In some embodiments, the fin structures 102A, 102B, 102C, and 102D are in direct contact with the semiconductor substrate 100. As shown in FIG. 3A, each of the fin structures 102A, 102B, 102C and 102D has a height $H_1$. The height $H_1$ may be in a range from about 50 nm to about 60 nm.

However, embodiments of the disclosure have many variations and/or modifications. In some other embodiments, the fin structures 102A, 102B, 102C, and 102D are not in direct contact with the semiconductor substrate 100. One or more other material layers may be formed between the semiconductor substrate 100 and the fin structures 102A, 102B, 102C, and 102D. For example, a dielectric layer may be formed therebetween.

As shown in FIG. 3A and FIG. 2, isolation features 104 are formed in the recesses to surround lower portions of the fin structures 102A, 102B, 102C, and 102D, in accordance with some embodiments. The isolation features 104 are used to define and electrically isolate various device elements formed in and/or over the semiconductor substrate 100. In some embodiments, the isolation features 104 include shallow trench isolation (STI) features, local oxidation of silicon (LOCOS) features, another suitable isolation feature, or a combination thereof.

In some embodiments, each of the isolation features 104 has a multi-layer structure. In some embodiments, the isolation features 104 are made of a dielectric material. The dielectric material may include silicon oxide, silicon nitride, silicon oxynitride, fluoride-doped silicate glass (FSG), low-K dielectric material, one or more other suitable materials, or a combination thereof. In some embodiments, an STI liner (not shown) is formed to reduce crystalline defects at the interface between the semiconductor substrate 100 and the isolation features 104. Similarly, the STI liner may also be used to reduce crystalline defects at the interface between the isolation features 104 and the fin structures 102A, 102B, 102C, and 102D.

In some embodiments, a dielectric material layer is deposited over the semiconductor substrate 100. The dielectric material layer covers the fin structures 102A, 102B, 102C, and 102D and fills the recesses between the fin structures. In some embodiments, the dielectric material layer is deposited using a chemical vapor deposition (CVD) process, an atomic layer deposition (ALD) process, a physical vapor deposition (PVD) process, a spin-on process, one or more other applicable processes, or a combination thereof. In some embodiments, a planarization process is used to thin down the dielectric material layer until the fin structures 102A, 102B, 102C, and 102D or hard mask elements defining the fin structures are exposed. The planarization process may include a chemical mechanical polishing (CMP) process, a grinding process, a dry polishing process, an etching process, one or more other applicable processes, or a combination thereof. Afterwards, the dielectric material layer is etched back such that the fin structures 102A, 102B, 102C, and 102D protrude from the top surface of the remaining dielectric material layer after the etching process. As a result, the remaining portions of the dielectric material layer form the isolation features 104, as shown in FIG. 3A and FIG. 2.

Afterwards, multiple gate stacks are formed over the semiconductor substrate 100 to partially cover the fin structures 102A, 102B, 102C, and 102D, as shown in FIG. 2 in accordance with some embodiments. As shown in FIG. 2, a first gate stack and a second gate stack including gate electrodes 108A and 108B and a gate dielectric layer 106 are formed. The first gate stack partially covers the fin structures 102A and 102B. The second gate stack partially covers the fin structures 102C and 102D.

In some embodiments, a gate dielectric layer 106 and a gate electrode layer are deposited over the isolation features 104 and the fin structures 102A, 102B, 102C, and 102D. In some embodiments, the gate dielectric layer 106 is made of or includes silicon oxide, silicon nitride, silicon oxynitride, dielectric material with a high dielectric constant (high-K), one or more other suitable dielectric materials, or a combination thereof. Examples of high-K dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof. In some embodiments, the gate dielectric layer 106 is a dummy gate dielectric layer 106 which will be removed subsequently. The dummy gate dielectric layer 106 is, for example, a silicon oxide layer.

In some embodiments, the gate dielectric layer 106 is deposited using a chemical vapor deposition (CVD) process, an atomic layer deposition (ALD) process, a thermal oxidation process, a physical vapor deposition (PVD) process, one or more other applicable processes, or a combination thereof.

In some embodiments, the gate electrode layer is a dummy gate electrode layer and is made of or includes a semiconductor material such as polysilicon. For example, the dummy gate electrode layer is deposited using a CVD process or another applicable process.

Afterwards, a patterned hard mask element 110 is formed over the gate electrode layer, as shown in FIG. 2 in accordance with some embodiments. The patterned hard mask element 110 is used to pattern the gate electrode layer and the gate dielectric layer 106 into one or more gate stacks. Afterwards, the gate electrode layer and the gate dielectric layer 106 are etched with the patterned hard mask element 110 as an etching mask to form the gate stacks, as shown in FIG. 2 in accordance with some embodiments.

Figure 3B:
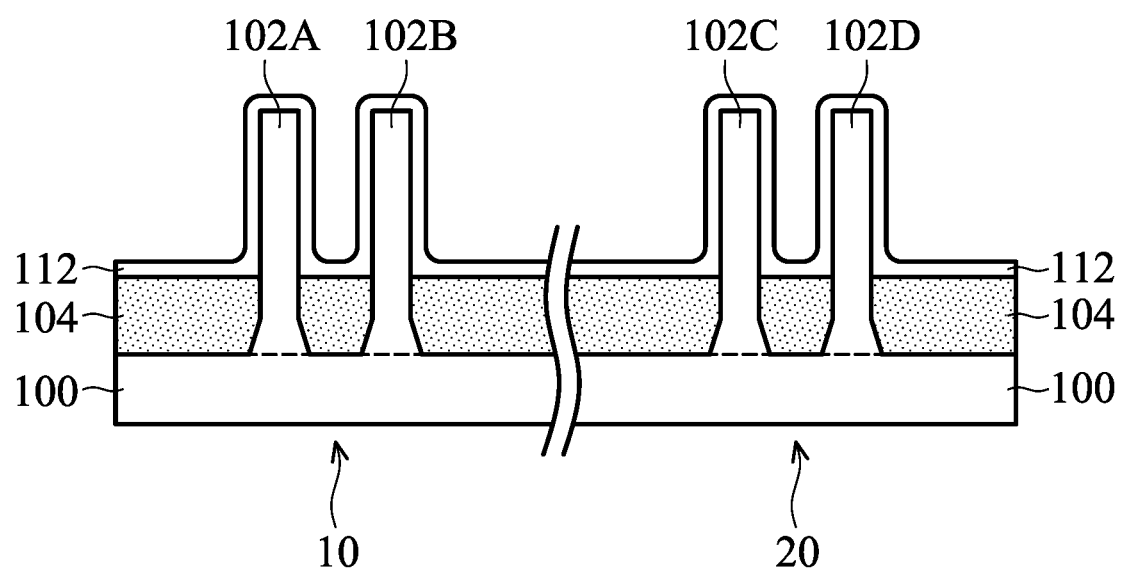

As shown in FIG. 3B, a spacer layer 112 is deposited over the fin structures 102A, 102B, 102C, and 102D, in accordance with some embodiments. The spacer layer 112 extends over the isolation features 104. The spacer layer 112 also extends on sidewalls and top surfaces of the fin structures 102A, 102B, 102C, and 102D. In some embodiments, the spacer layer 112 extends on sidewalls and top surfaces of the gate stacks. The spacer layer 112 may be made of or include one or more dielectric materials. Examples of the dielectric material(s) include silicon nitride, silicon oxynitride, silicon carbide, silicon oxide, silicon oxycarbide, one or more other suitable materials, or a combination thereof. The spacer layer 112 may be deposited using a CVD process, an ALD process, a PVD process, one or more other applicable processes, or a combination thereof.

Figure 3C:
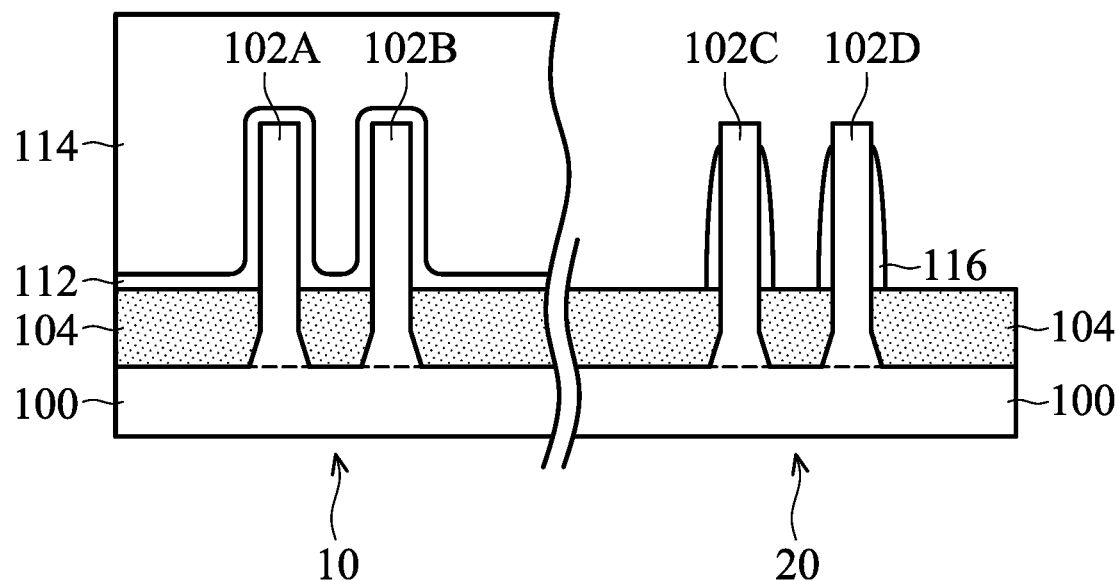

As shown in FIG. 3C, a mask element 114 is formed to cover a part of the spacer layer 112 over the fin structures 102A and 102B, in accordance with some embodiments. The mask element 114 is used as an etching mask during a subsequent etching process for forming spacer elements on sidewalls of the fin structures 102C and 102D. In some embodiments, the mask element 114 is made of a different material than that of the spacer layer 112. In some embodiments, a patterned photoresist layer is used to define the mask element 114. In some other embodiments, the mask element 114 includes a patterned photoresist layer.

In some embodiments, the mask element 114 is a blanket layer covering the fin structures 102A and 102B. However, many variations and/or modifications can be made to embodiments of the disclosure. In some other embodiments, the mask element 114 is a conformal layer covering the sidewalls and top surfaces of the fin structures 102A and 102B.

Afterwards, the spacer layer 112 not covered by the mask element 114 is partially removed, as shown in FIG. 3C in accordance with some embodiments. As a result, some remaining portions of the spacer layer 112 form spacer elements 116 over the sidewalls of the fin structures 102C and 102D. Some other remaining portions of the spacer layer 112 may form gate spacer elements over the sidewalls of the gate stack not covered by the mask element 114. For example, gate spacer elements are formed on sidewalls of the gate electrode 108B. In some embodiments, an etching process is used to partially remove the spacer layer 112 so as to form the spacer elements 116. The etching process may be an anisotropic etching process.

In some embodiments, the etching process for forming the spacer elements 116 is a plasma-involved dry etching process. A mixture of gases may be used to generate the plasma. The mixture of gases may include $CH_4$, HBr, $O_2$, one or more other suitable gases, or a combination thereof.

Figure 3D:
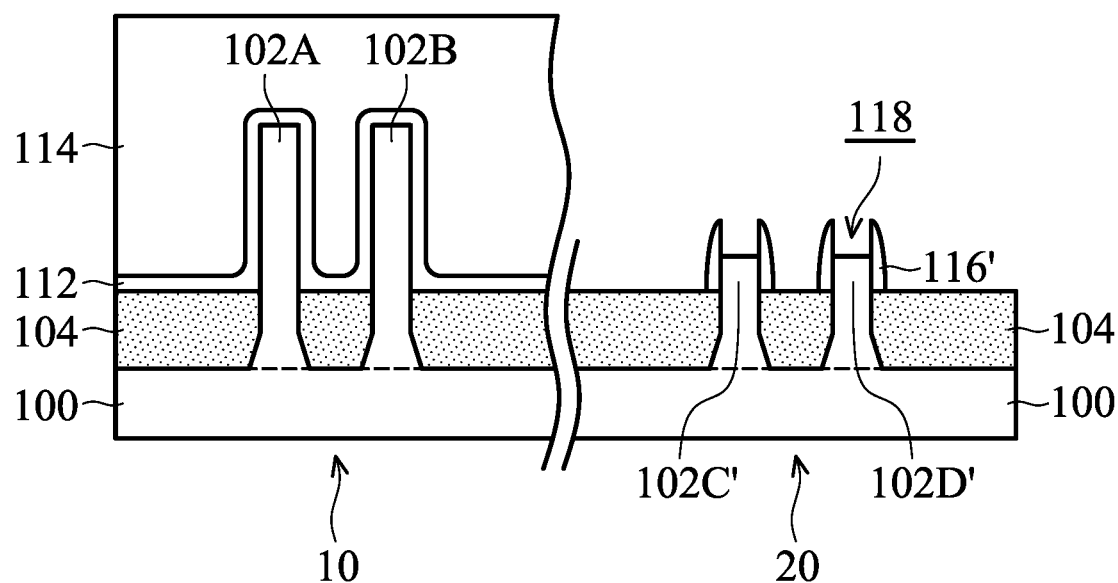

As shown in FIG. 3D, the fin structures 102C and 102D are partially removed, in accordance with some embodiments. As a result, recessed (or thinned) fin structures 102C' and 102D' are formed. In some embodiments, an etching process is used to partially remove the fin structures 102C and 102D. In some embodiments, the etching process for partially removing the fin structures 102C and 102D is a plasma-involved dry etching process. A mixture of gases may be used to generate the plasma. The mixture of gases may include HBr, $O_2$, one or more other suitable gases, or a combination thereof.

The etchant used in the etching process may also partially or slightly remove the spacer elements 116. Therefore, spacer elements 116' that are lower than the spacer elements 116 are formed, as shown in FIG. 3D in accordance with some embodiments. In some embodiments, recesses 118 surrounded by the spacer elements 116' are formed on the fin structures 102C' and 102D'.

Figure 3E:
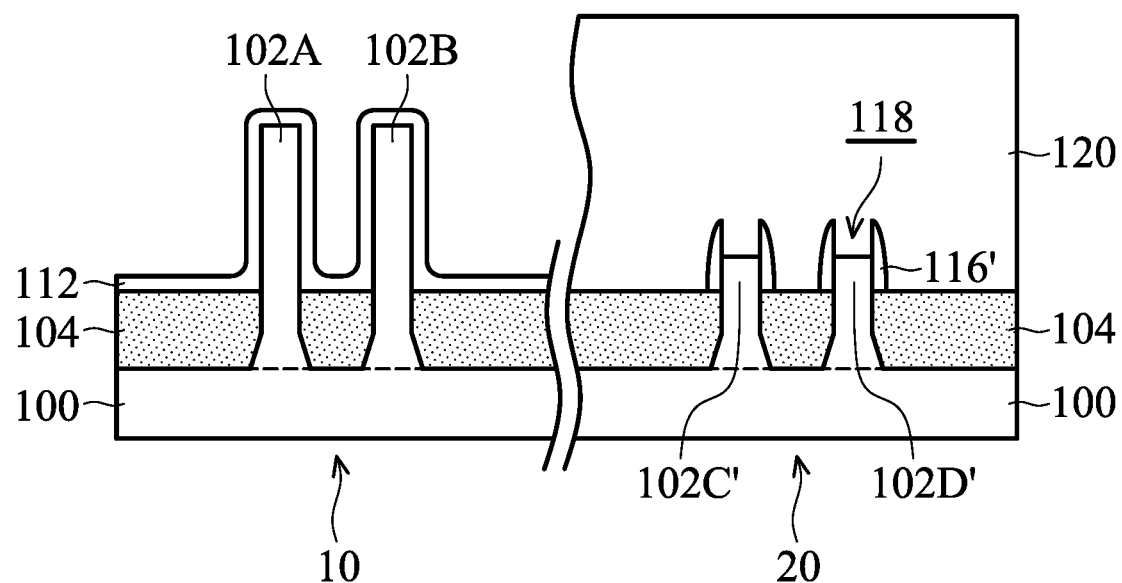

As shown in FIG. 3E, the mask element 114 is removed, and a mask element 120 is formed to cover the spacer elements 116' and the fin structures 102C' and 102D', in accordance with some embodiments. A portion of the spacer layer 112 covering the fin structures 102A and 102B is exposed without being covered by the mask element 120, as shown in FIG. 3E. The material and formation method of the mask element 120 may be the same as or similar to those of the mask element 114.

Figure 3F:
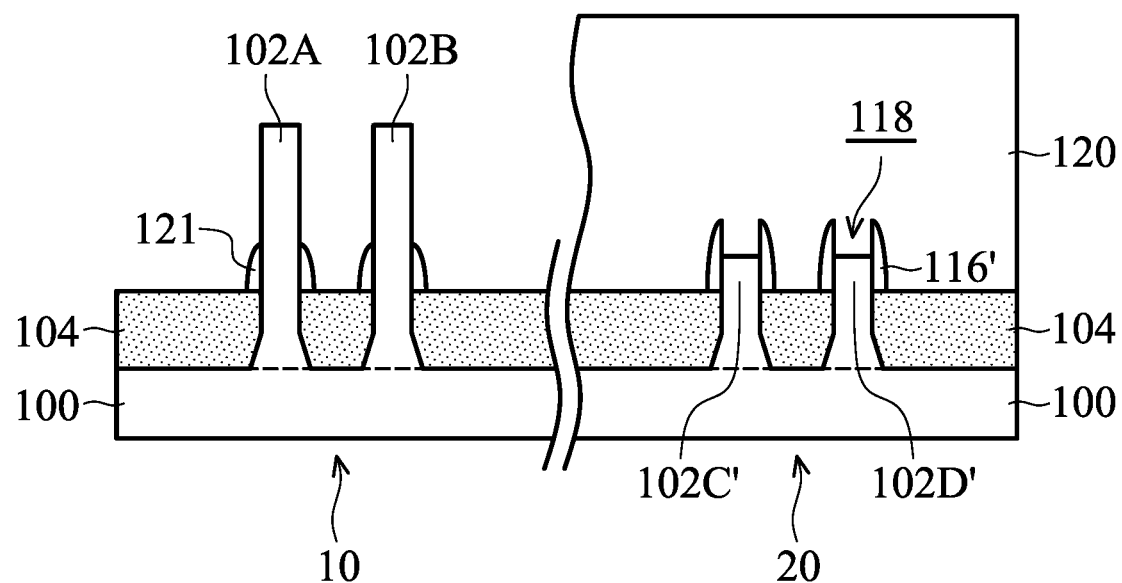

As shown in FIG. 3F, the spacer layer 112 not covered by the mask element 120 is partially removed, in accordance with some embodiments. As a result, some remaining portions of the spacer layer 112 form spacer elements 121 over the sidewalls of the fin structures 102A and 102B. In some embodiments, each of the spacer elements 121 is shorter than each of the spacer elements 116'. Some other remaining portions of the spacer layer 112 may form spacer elements over the sidewalls of the gate stack not covered by the mask element 120. For example, spacer elements are formed on sidewalls of the gate electrode 108A in FIG. 2. In some embodiments, an etching process is used to partially remove the spacer layer 112 so as to form the spacer elements 121. The etching process may be an anisotropic etching process.

In some embodiments, the etching process used for forming the spacer elements 121 may be the same as or similar to that used for forming the spacer elements 116 as illustrated in FIG. 3C. In some embodiments, the etching time for forming the spacer elements 121 is longer than that for forming the spacer elements 116. As a result, each of the spacer elements 121 is shorter than each of the spacer elements 116 or 116', as shown in FIG. 3F. The etching time for forming the spacer elements 121 may in a range from about 30 seconds to about 60 seconds. The etching time for forming the spacer elements 116 may in a range from about 20 seconds to about 40 seconds.

Figure 3G:
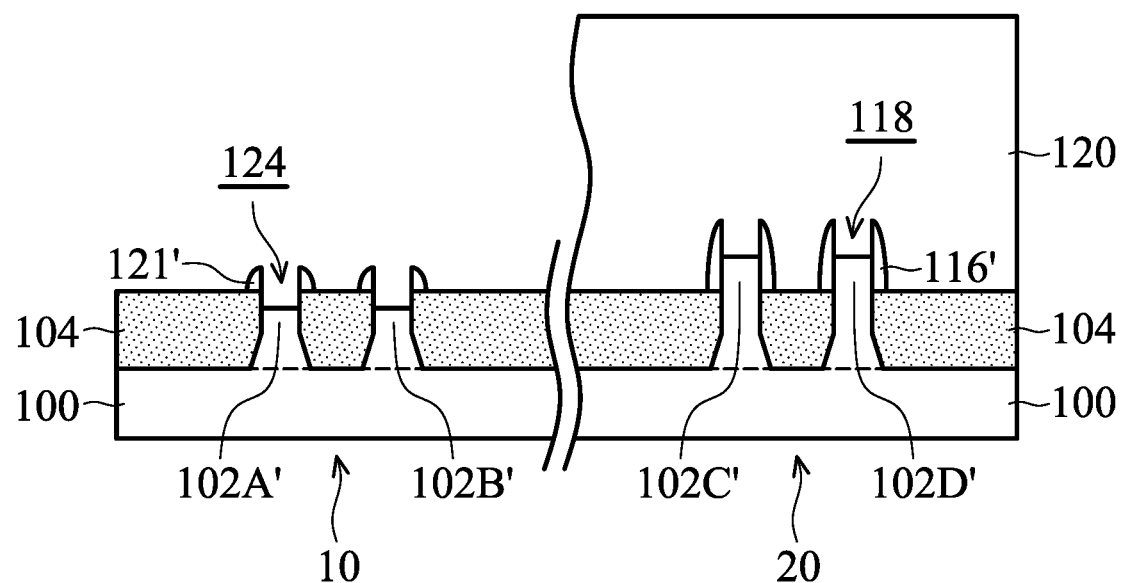

As shown in FIG. 3G, the fin structures 102A and 102B are partially removed, in accordance with some embodiments. As a result, recessed (or thinned) fin structures 102A' and 102B' are formed. In some embodiments, an etching process is used to partially remove the fin structures 102A and 102B. The etchant used in the etching process may also partially or slightly remove the spacer elements 121. Therefore, spacer elements 121' that are lower than the spacer elements 121 are formed, as shown in FIG. 3G in accordance with some embodiments. In some embodiments, recesses 124 surrounded by the spacer elements 121' are formed on the fin structures 102A' and 102B'.

In some embodiments, the etching process used for partially removing the fin structures 102A and 102B may be the same as or similar to that used for partially removing the fin structures 102C and 102D as illustrated in FIGS. 3C-3D. In some embodiments, the etching time for partially removing the fin structures 102A and 102B is longer than that for partially removing the fin structures 102C and 102D. As a result, each of the fin structures 102A' and 102B' is shorter than each of the fin structures 102C' and 102D', as shown in FIG. 3G. The etching time for forming the (recessed) fin structures 102A' and 102B' may be in a range from about 30 seconds to about 60 seconds. The etching time for forming the (recessed) fin structures 102C' and 102D' may be in a range from about 20 seconds to about 50 seconds.

Many variations and/or modifications can be made to embodiments of the disclosure. In some other embodiments, the spacer elements 121 are completely removed during or after the formation of the fin structures 102A' and 102B'. In these cases, the spacer elements 121' are not formed.

Figure 3H:
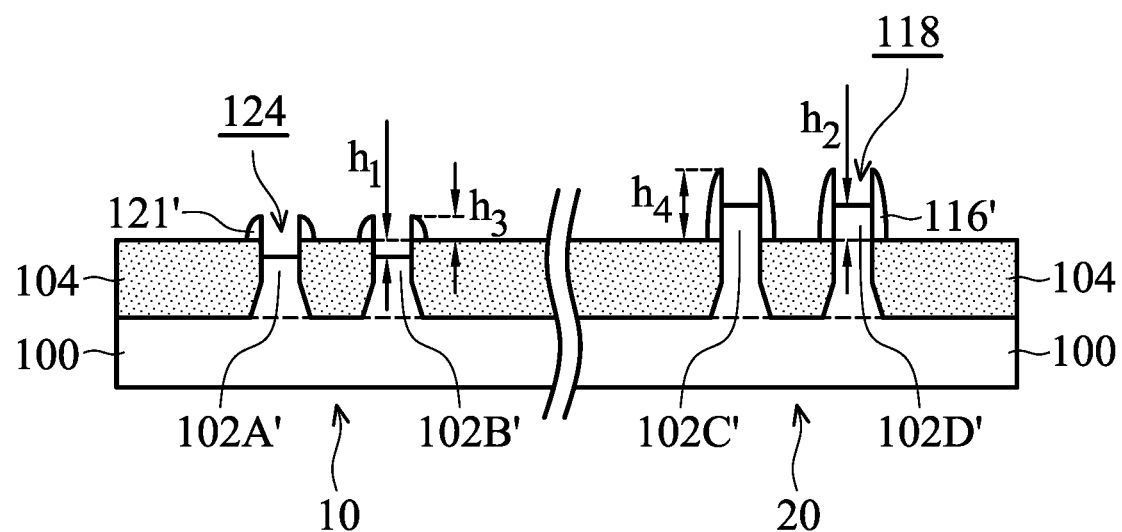

As shown in FIG. 3H, the mask element 120 is removed, in accordance with some embodiments. As a result, the fin structures 102A', 102B', 102C' and 102D' and the spacer elements 121' and 116' are exposed. In some embodiments, each of the fin structures 102C' and 102D' is taller than each of the fin structures 102A' and 102B'. The top surface of the fin structures 102C' or 102D' is higher than the top surfaces of the fin structures 102A' and 102B', as shown in FIG. 3H.

In some embodiments, the top surfaces of the fin structures 102A' and 102B' are lower than the top surface of the isolation features 104 by a height $h_1$, as shown in FIG. 3H. The height $h_1$ may be in a range from about 1 nm to about 10 nm. In some embodiments, the top surface of the fin structures 102C' and 102D' are higher than the top surface of the isolation features 104 by a height $h_2$, as shown in FIG. 3H. The height $h_2$ may be in a range from about 5 nm to about 15 nm.

In some embodiments, each of the spacer elements 116' is taller than each of the spacer elements 121'. In some embodiments, one or each of the spacer elements 121' has a height $h_3$, and one or each of the spacer elements 116' has a height $h_4$, as shown in FIG. 3H. The height $h_3$ may be in a range from about 2 nm to about 15 nm. In some embodiments, the spacer elements 121' are completely removed. In these cases, the height $h_3$ is zero. The height $h_4$ may be in a range from about 10 nm to about 30 nm. In some embodiments, a height ratio ($h_3/h_4$) of the height $h_3$ to the height $h_4$ is in a range from about 0 to about 0.5. In some cases, if the height ratio ($h_3/h_4$) is greater than about 0.5, the height $h_3$ may be too high, which might negatively affect a subsequent epitaxial growth of a merged semiconductor structure.

Figure 3I:
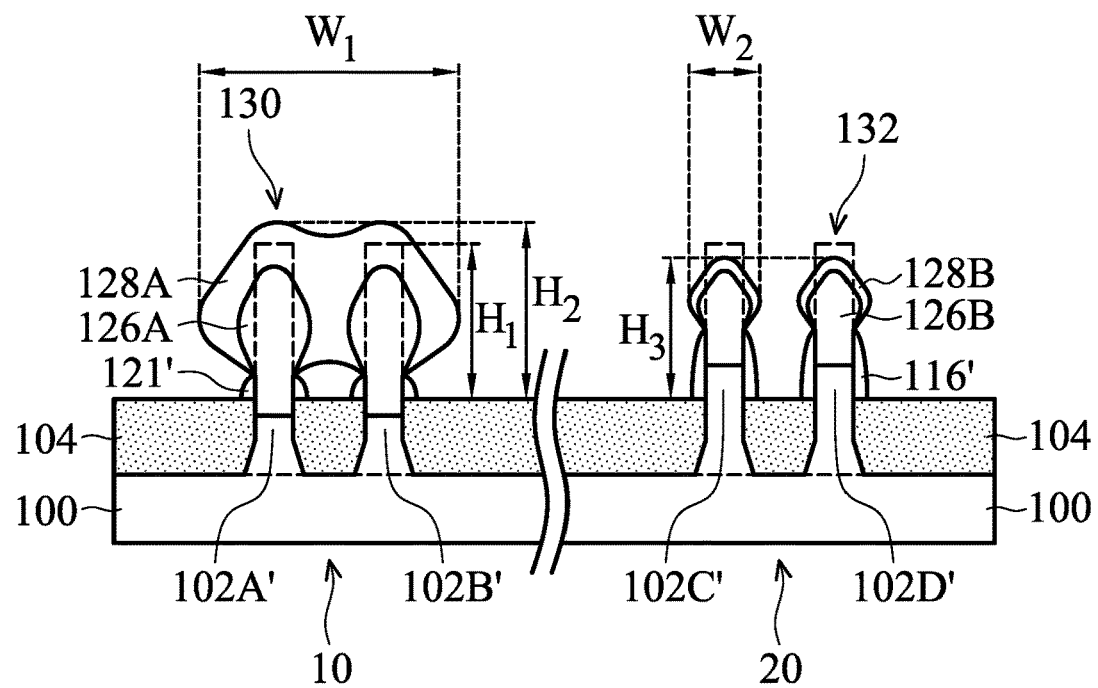

As shown in FIG. 3I, one or more semiconductor materials are epitaxially grown over the fin structures 102A', 102B', 102C', and 102D', in accordance with some embodiments. As a result, a merged semiconductor element 130 is formed on the fin structures 102A' and 102B'. The merged semiconductor element 130 has a first portion connecting the fin structure 102A' and a second portion connecting the fin structure 102B'. Isolated semiconductor elements 132 are formed on the fin structures 102C' and 102D', respectively. The merged semiconductor element 130 may serve as a source/drain structure of a transistor. The isolated semiconductor elements 132 which are separated from each other by a distance may serve as source/drain structures of different transistors. In some embodiments, the merged semiconductor element 130 and the isolated semiconductor elements 132 are simultaneously formed.

In some embodiments, the merged semiconductor element 130 is wider and taller than each of the isolated semiconductor elements 132, as shown in FIG. 3I. As shown in FIG. 3I, the merged semiconductor element 130 has a width $W_1$, and each of the isolated semiconductor elements 132 has a width $W_2$. The width $W_1$ is greater than the width $W_2$. The merged semiconductor element 130 thus has a greater surface area than the isolated semiconductor element 132. Therefore, resistance between the merged semiconductor element 130 and a conductive contact formed thereon may be reduced. The electrical properties of the semiconductor device structure are significantly improved.

As shown in FIG. 3I, the merged semiconductor element 130 has a height $H_2$, and each of the isolated semiconductor elements 132 has a height $H_3$. In some embodiments, the height $H_2$ is greater than the height $H_3$. In some embodiments, each of the fin structures 102A, 102B, 102C, and 102D originally has a height $H_1$, as shown in FIG. 3A. In some embodiments, the height $H_2$ is greater than the height $H_1$. In some embodiments, the height $H_3$ is smaller than the height $H_1$. In some other embodiments, the height $H_3$ is substantially equal to the height $H_1$.

The height $H_2$ of the merged semiconductor element 130 may be in a range from about 55 nm to about 70 nm. The height $H_3$ of the isolated semiconductor element 132 may be in a range from about 40 nm to about 60 nm. In some embodiments, the height ratio ($H_3/H_2$) of the height $H_3$ to height $H_2$ may be in a range from about 0.7 to about 0.9. In some cases, if the height ratio ($H_3/H_2$) is smaller than about 0.7, the height different between the merged semiconductor element 130 and the isolated semiconductor element 132 may be too much. A subsequent formation of conductive contacts might be negatively affected. In some other cases, if the height ratio ($H_3/H_2$) is greater than about 0.9, the isolated semiconductor element 132 might come in contact with a neighboring isolated semiconductor element 132 and be grown to be a merged semiconductor element. As a result, the devices in the second region 20 might not be able to provide the designed functions.

In some embodiments, the growth of the merged semiconductor element 130 and the isolated semiconductor elements 132 are performed simultaneously. In some other embodiments, the growth of the merged semiconductor element 130 and the isolated semiconductor elements 132 are performed separately in different processes.

In some embodiments, because each of the spacer elements 121' has a small height, the epitaxial growth of the semiconductor material on the fin structures 102A' and 102B' is less confined than the epitaxial growth of the semiconductor material on the fin structures 102C' and 102D' surrounded by the spacer elements 116' having a greater height. Therefore, the grown semiconductor material on the fin structures 102A' and 102B' may reach each other and together form the merged semiconductor element 130. The grown semiconductor material on the fin structures 102C' and 102D' is confined due to the spacer elements 116' with a greater height than the spacer elements 121'. Therefore, the grown semiconductor material on the fin structures 102C' and 102D' does not reach each other. As a result, the isolated semiconductor elements 132 on the fin structures 102C' and 102D' are prevented from reaching each other. In some embodiments, the isolated semiconductor elements 132 are designed to be separated from each other for some design purposes.

In some embodiments, the merged semiconductor element 130 and the isolated semiconductor elements 132 are made of a p-type semiconductor material. For example, the merged semiconductor element 130 and the isolated semiconductor elements 132 may include epitaxially grown silicon germanium. In some other embodiments, the merged semiconductor element 130 and the isolated semiconductor elements 132 are made of an n-type semiconductor material. The merged semiconductor element 130 and the isolated semiconductor elements 132 may include epitaxially grown silicon, epitaxially grown silicon carbide (SiC), epitaxially grown silicon phosphide (SiP), or another suitable epitaxially grown semiconductor material.

In some embodiments, the merged semiconductor element 130 and the isolated semiconductor elements 132 are formed using a selective epitaxy growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, one or more other applicable processes, or a combination thereof. The formation process of the merged semiconductor element 130 and the isolated semiconductor elements 132 may use gaseous and/or liquid precursors.

In some embodiments, both the merged semiconductor element 130 and the isolated semiconductor elements 132 are grown in the same process chamber. The merged semiconductor element 130 and the isolated semiconductor elements 132 may be formed using an in-situ epitaxial growth process.

Many variations and/or modifications can be made to embodiments of the disclosure. In some other embodiments, the merged semiconductor element 130 and the isolated semiconductor elements 132 are grown separately in different process chambers.

In some embodiments, the merged semiconductor element 130 and the isolated semiconductor elements 132 include dopants. For example, the merged semiconductor element 130 and the isolated semiconductor elements 132 are p-type doped, and the dopants may include boron, gallium, or a combination thereof. In some embodiments, multiple implantation processes are performed to dope the merged semiconductor element 130 and the isolated semiconductor elements 132. In some embodiments, the merged semiconductor element 130 and the isolated semiconductor elements 132 are not doped during the growth of the merged semiconductor element 130 and the isolated semiconductor elements 132. After the epitaxial growth, the merged semiconductor element 130 and the isolated semiconductor elements 132 are doped in a subsequent process.

In some embodiments, the doping is achieved using an ion implantation process, a plasma immersion ion implantation process, a gas and/or solid source diffusion process, one or more other applicable processes, or a combination thereof. In some embodiments, the merged semiconductor element 130 and the isolated semiconductor elements 132 are further exposed to one or more annealing processes to activate the dopants. For example, a rapid thermal annealing process is used.

In some embodiments, the merged semiconductor element 130 and the isolated semiconductor elements 132 are doped in-situ during the growth of the merged semiconductor element 130 and the isolated semiconductor elements 132. In some embodiments, a first semiconductor-containing gas is introduced into the process chamber to epitaxially grow inner portions 126A of the merged semiconductor element 130 and inner portions 126B of the isolated semiconductor elements 132. Afterwards, a second semiconductor-containing gas is introduced into the same process chamber to epitaxially grow an outer portion 128A of the merged semiconductor element 130 and outer portions 128B of the isolated semiconductor elements 132. The outer portion 128A surrounds the inner portion 126A, and the outer portion 128B surrounds the inner portion 126B, as shown in FIG. 3I.

In some embodiments, the first semiconductor-containing gas and the second semiconductor-containing gas each contains silicon and germanium. In some embodiments, one or both of the first semiconductor-containing gas and the second semiconductor-containing gas contains dopants. In some embodiments, the second semiconductor-containing gas has a different dopant concentration than that of the first semiconductor-containing gas. In some embodiments, the second semiconductor-containing gas has a greater dopant concentration than that of the first semiconductor-containing gas.

In some embodiments, the outer portion 128B of each of the isolated semiconductor elements 132 has a greater dopant concentration than that of the inner portion 126B. In some embodiments, the outer portion 128A of the merged semiconductor element 130 has a greater dopant concentration than that of the inner portion 126A. In some embodiments, the dopant concentration of the inner portion 126A is the same as that of the inner portion 126B. In some embodiments, the dopant concentration of the outer portion 128A is the same as that of the outer portion 128B. The inner portion 126A and/or the inner portion 126B may have a dopant concentration that is in a range from about $10^{20}$ atoms/cm$^3$ to about $10^{21}$ atoms/cm$^3$. The outer portion 128A and/or 128B may have a dopant concentration that is in a range from about $10^{21}$ atoms/cm$^3$ to about $10^{22}$ atoms/cm$^3$.

In some embodiments, during the growth of the merged semiconductor element 130, the grown semiconductor material on the neighboring semiconductor fins reach each other and provide a plane for the semiconductor material continue to grow at a higher speed than that is grown on the inner portion 126B of the isolated semiconductor element 132. As a result, the outer portion 128A of the merged semiconductor element 130 is larger than the outer portion 128B of the isolated semiconductor element 132. The merged semiconductor element 130 has a greater volume ratio of the outer portion to the inner portion than that of the isolated semiconductor element 132. The outer portion 128A occupies a first fraction of the merged semiconductor element 130. The outer portion 128B occupies a second fraction of the isolated semiconductor element 132. In some embodiments, the first fraction is greater than the second fraction. In some embodiments, the outer portion 128A is larger than each of the inner portions 126A of the merged semiconductor element 130. In some embodiments, the outer portion 128B is smaller than the inner portion 126B of the isolated semiconductor element 132. As mentioned above, the outer portion has a greater dopant concentration than the inner portion. Therefore, the merged semiconductor element 130 that has a larger outer portion may have a higher conductivity than the isolated semiconductor element 132.

Figure 3J:
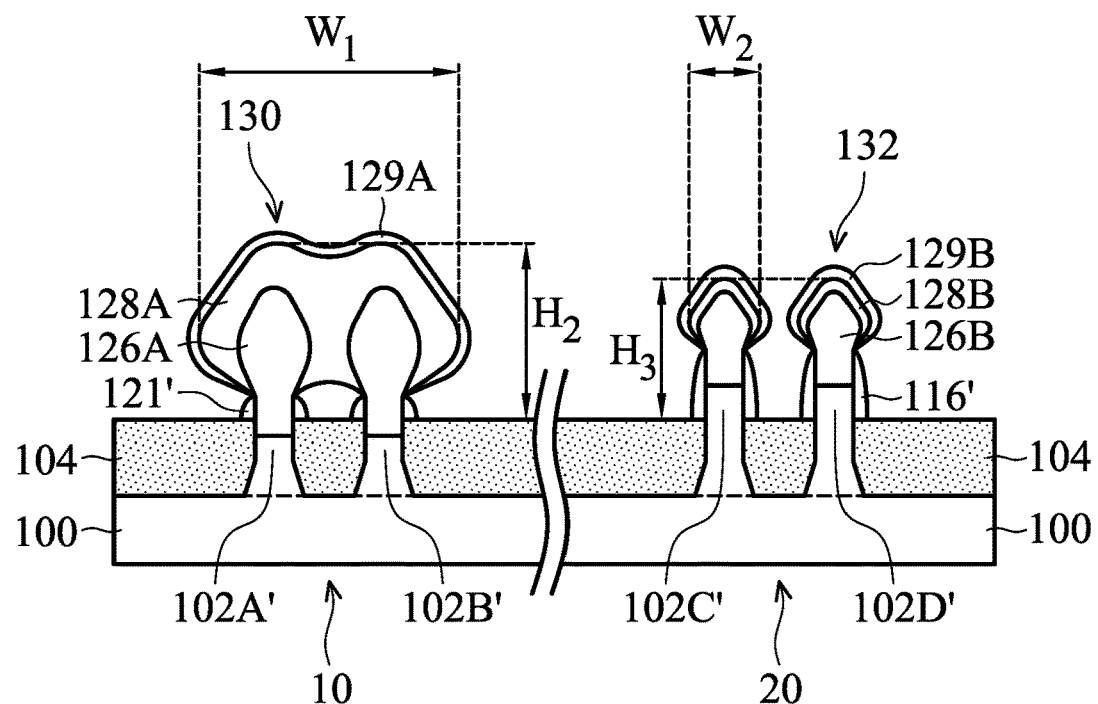

As shown in FIG. 3J, a surrounding portion 129A of the merged semiconductor element 130 and surrounding portions 129B of the isolated semiconductor elements 132 are formed, in accordance with some embodiments. In some embodiments, the surrounding portions 129A and 129B surround the outer portions 128A and 128B, respectively. In some embodiments, the surrounding portion 129A has a lower dopant concentration than that of the outer portion 128A. In some embodiments, the surrounding portion 129B has a lower dopant concentration than that of the outer portion 128B. In some embodiments, the surrounding portions 129A and 129B are simultaneously formed. In some embodiments, the surrounding portions 129A and 129B are in-situ formed in the same process chamber for forming the outer portions 128A and 128B.

In the embodiments illustrated in FIGS. 3A-3J, two mask elements including the mask elements 114 and 120 are used for forming the spacer elements 121' and 116'. However, many variations and/or modifications can be made to embodiments of the disclosure. In some other embodiments, only one mask element is used for forming spacer elements with different heights.

Figure 4A:
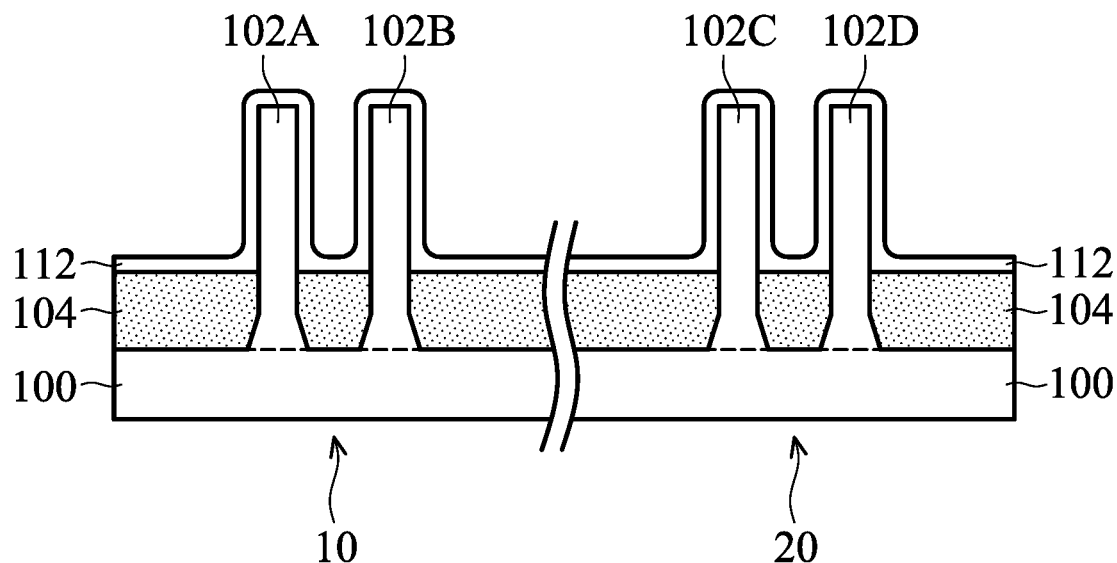
FIGS. 4A-4E are cross-sectional views of various stages of a process for forming a semiconductor device structure, in accordance with some embodiments.

FIGS. 4A-4E are cross-sectional views of various stages of a process for forming a semiconductor device structure, in accordance with some embodiments. As shown in FIG. 4A, a structure the same as or similar to that shown in FIG. 3B is formed or received, in accordance with some embodiments.

Figure 4B:
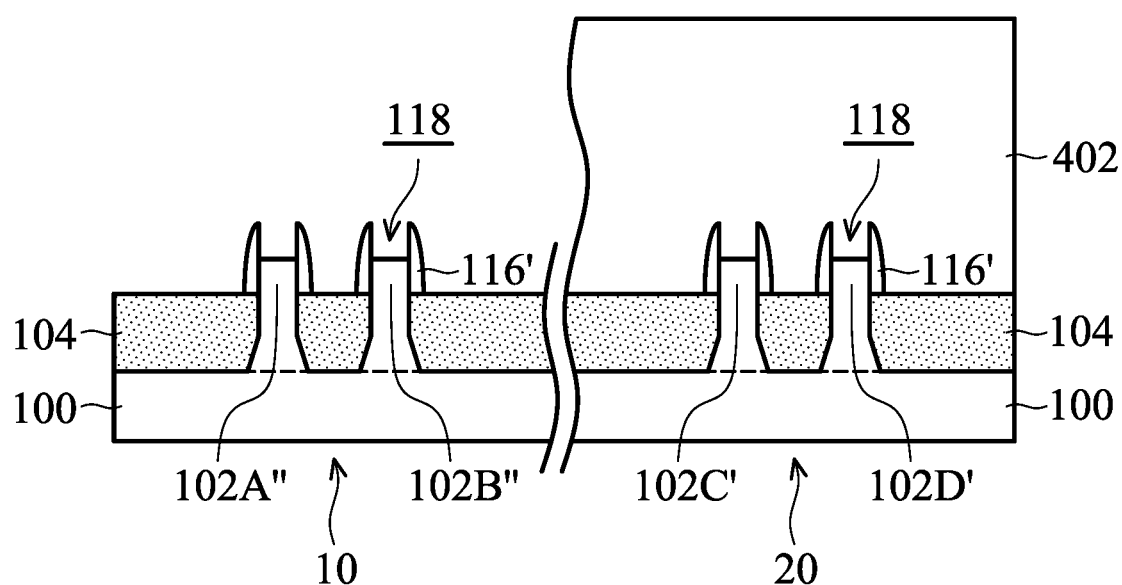

Afterwards, etching processes the same as or similar to the etching processes illustrated in FIGS. 3C-3D are performed without the formation of the mask element 114, as shown in FIG. 4B in accordance with some embodiments. As a result, spacer elements 116' are formed, and the fin structures are partially removed to form the fin structures 102A", 102B", 102C' and 102D', as shown in FIG. 4B. The spacer elements 116' extend along the sidewalls of the fin structures 102A", 102B", 102C' and 102D'.

Afterwards, a mask element 402 is formed to cover the fin structures 102C' and 102D' and the spacer elements 116' surrounding the fin structures 102C' and 102D', as shown in FIG. 4B in accordance with some embodiments. The fin structures 102A" and 102B" and the spacer elements 116' surrounding the fin structures 102A" and 102B" are exposed without being covered by the mask element 402, as shown in FIG. 4B. The material and formation method of the mask element 402 may be the same as or similar to those of the mask element 114 illustrated in FIG. 3D.

Figure 4C:
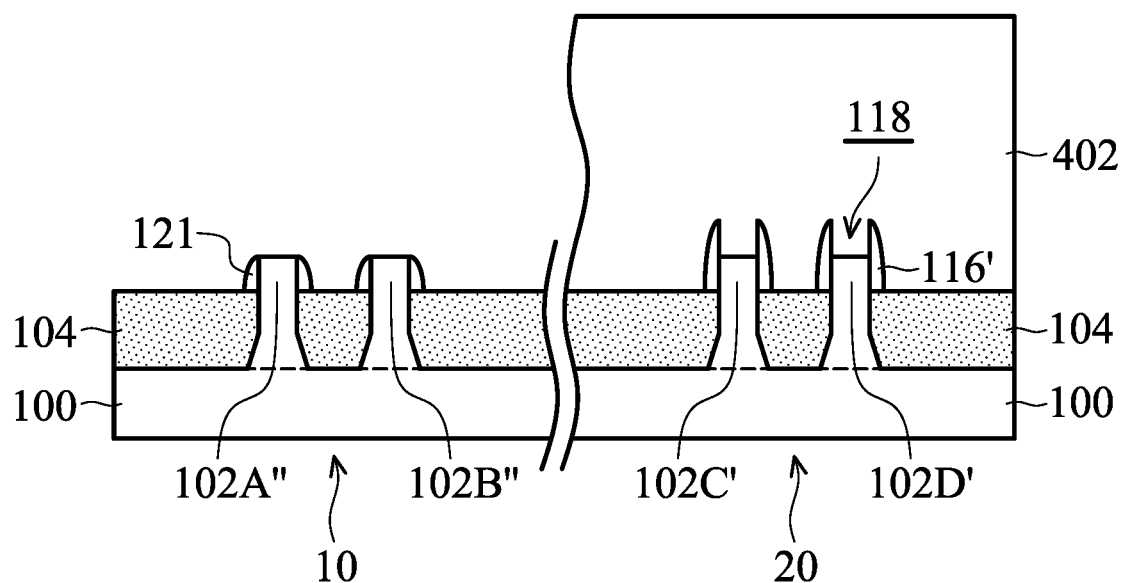

As shown in FIG. 4C, the spacer elements 116' not covered by the mask element 402 is partially removed, in accordance with some embodiments. As a result, spacer elements 121 which are shorter than the spacer elements 116' are formed over the sidewalls of the fin structures 102A" and 102B". In some embodiments, each of the spacer elements 121 is shorter than each of the spacer elements 116'. In some embodiments, an etching process is used to partially remove the spacer elements 116' not covered by the mask element 402 so as to form the spacer elements 121. The etching process may be an anisotropic etching process.

Figure 4D:
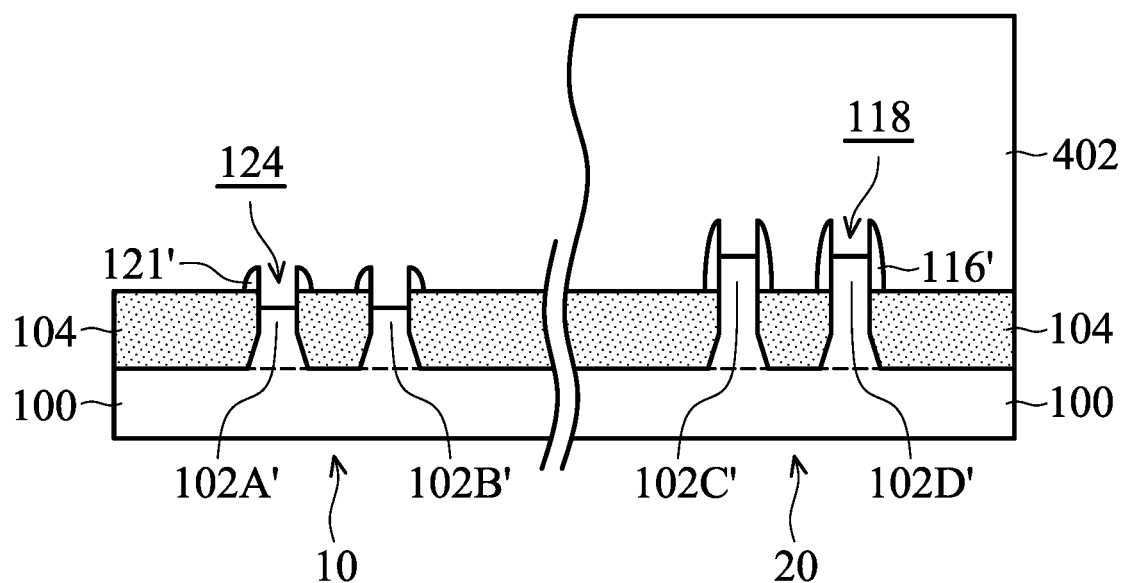

As shown in FIG. 4D, the fin structures 102A" and 102B" are partially removed, in accordance with some embodiments. As a result, recessed (or thinned) fin structures 102A' and 102B' are formed. In some embodiments, an etching process is used to partially remove the fin structures 102A" and 102B". The etchant used in the etching process may also partially or slightly remove the spacer elements 121. Therefore, spacer elements 121' that are lower than the spacer elements 121 are formed, as shown in FIG. 4D in accordance with some embodiments. In some embodiments, recesses 124 surrounded by the spacer elements 121' are formed on the fin structures 102A' and 102B'.

Many variations and/or modifications can be made to embodiments of the disclosure. In some other embodiments, the spacer elements 121 are completely removed during or after the formation of the fin structures 102A' and 102B'. In these cases, the spacer elements 121' are not formed.

Figure 4E:
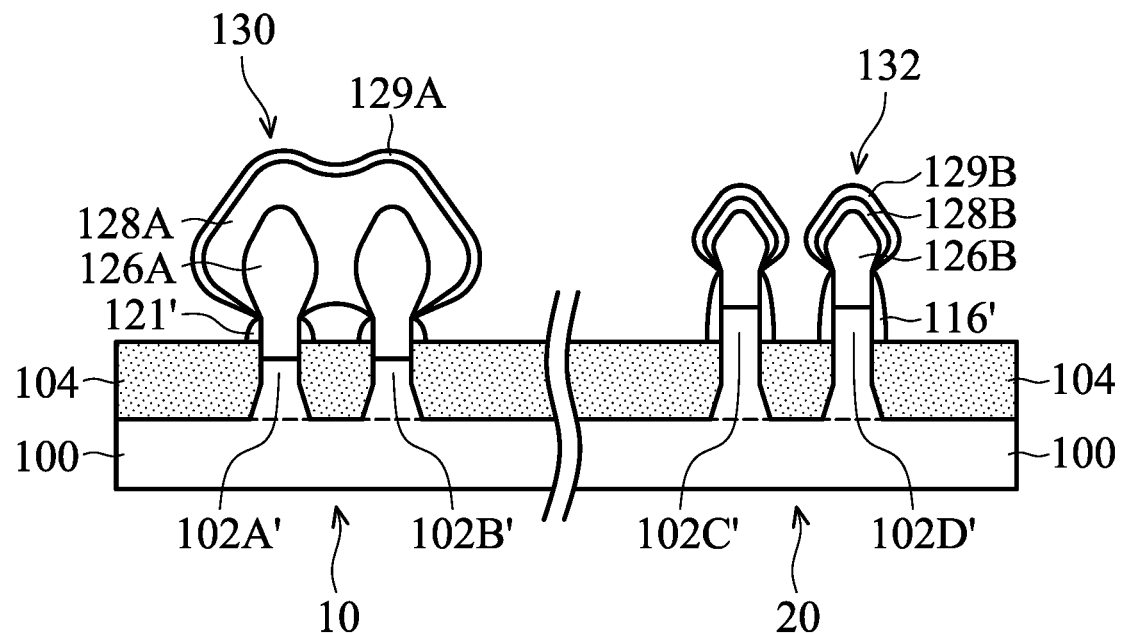

As shown in FIG. 4E, the mask element 402 is removed, in accordance with some embodiments. As a result, the fin structures 102A', 102B', 102C' and 102D' and the spacer elements 121' and 116' are exposed. In some embodiments, each of the fin structures 102C' and 102D' is taller than each of the fin structures 102A' and 102B'. The top surface of the fin structures 102C' or 102D' is higher than the top surfaces of the fin structures 102A' and 102B', as shown in FIG. 4E. In some embodiments, each of the spacer elements 116' is taller than each of the spacer elements 121'.

Afterwards, one or more semiconductor materials are epitaxially grown over the fin structures 102A', 102B', 102C', and 102D', as shown in FIG. 4E in accordance with some embodiments. Similar to the embodiments shown in FIG. 3I, the merged semiconductor element 130 is formed on the fin structures 102A' and 102B'. The isolated semiconductor elements 132 are formed on the fin structures 102C' and 102D', respectively. The merged semiconductor element 130 may serve as a source/drain structure of a transistor. The isolated semiconductor elements 132 which are separated from each other by a distance may serve as source/drain structures of different transistors. Afterwards, similar to the embodiments illustrated in FIG. 3J, surrounding portions 129A and 129B are formed, as shown in FIG. 4E in accordance with some embodiments.

Figure 5:
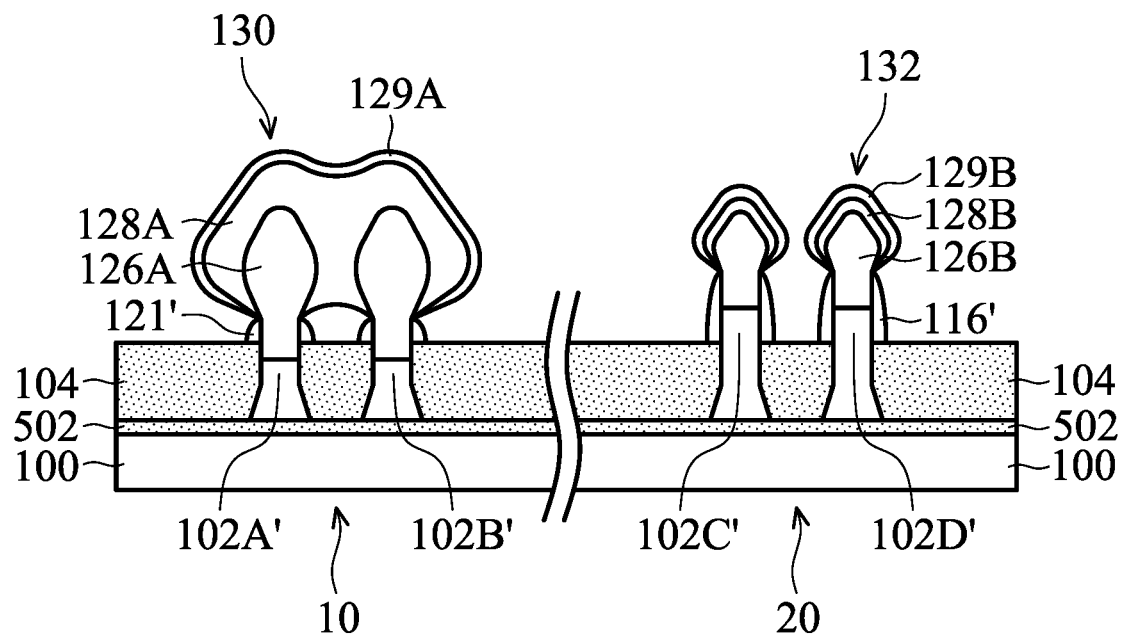
FIG. 5 is a cross-sectional view of a semiconductor device structure, in accordance with some embodiments.

Many variations and/or modifications can be made to embodiments of the disclosure. In some other embodiments, the fin structures 102A, 102B, 102C, and 102D are not in direct contact with the semiconductor substrate 100. FIG. 5 is a cross-sectional view of a semiconductor device structure, in accordance with some embodiments. In some embodiments, the semiconductor substrate 100 is separated from the fin structures 102A, 102B, 102C, and 102D by an insulating layer 502. The insulating layer 502 may be made of or include silicon oxide, silicon nitride, silicon oxynitride, silicon carbide, one or more other suitable materials, or a combination thereof. In these cases, the fin structures 102A, 102B, 102C, and 102D may be formed by patterning a semiconductor layer originally formed over the insulating layer 502.

Figure 6:
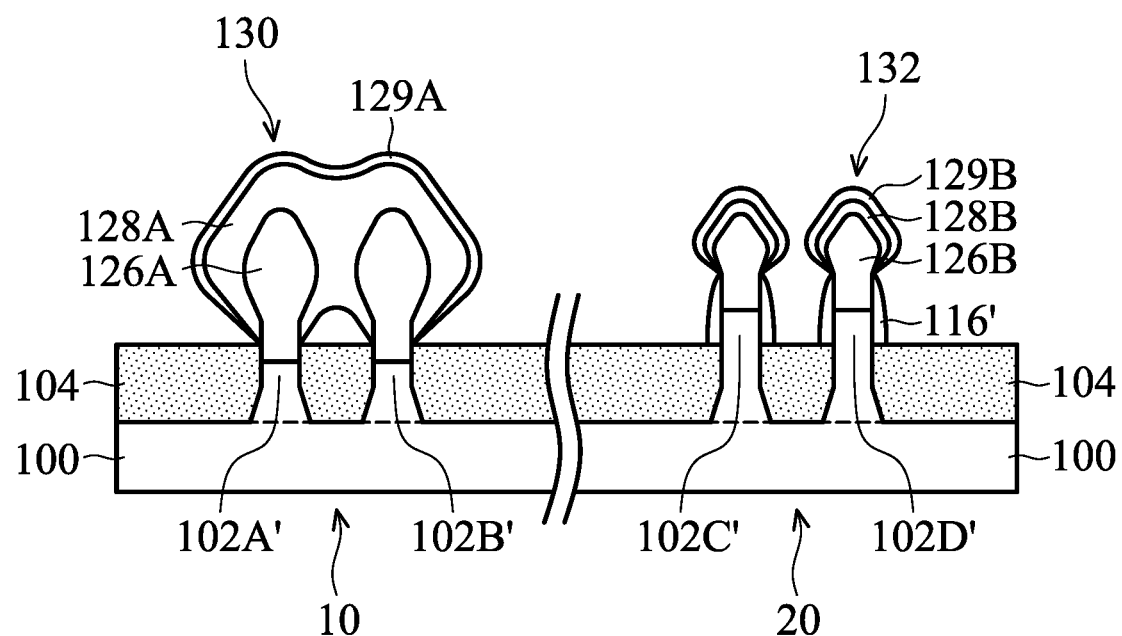
FIG. 6 is a cross-sectional view of a semiconductor device structure, in accordance with some embodiments.

As mentioned above, in some embodiments, the spacer elements 121' are not formed. FIG. 6 is a cross-sectional view of a semiconductor device structure, in accordance with some embodiments. As shown in FIG. 6, the spacer layer 112 over the sidewalls of the fin structures 102A' and 102B' are completely removed. In these cases, the merged semiconductor element 130 may extends from and be in direct contact with the isolation feature 104, as shown in FIG. 6.

Embodiments of the disclosure form spacer elements with different heights on sidewalls of different fin structures. Because the spacer elements have different heights, a subsequent epitaxial growth of a semiconductor material on the fin structures is confined in different degrees. As a result, a merged semiconductor element and a non-merged semiconductor element are formed in a single epitaxial growth process. Fabrication cost and time are significantly improved.

In accordance with some embodiments, a method for forming a semiconductor device structure us provided. The method includes forming a first fin structure, a second fin structure, and a third fin structure over a semiconductor substrate. The method also includes forming first spacer elements over sidewalls of the first fin structure and sidewalls of the second fin structure. The method further includes partially removing the first fin structure and the second fin structure after the formation of the first spacer elements. In addition, the method includes forming second spacer elements over sidewalls of the third fin structure, and each of the second spacer elements is taller than each of the first spacer elements. The method includes partially removing the third fin structure after the formation of the second spacer elements. After the first fin structure, the second fin structure, and the third fin structure are partially removed, the method also includes epitaxially growing a semiconductor material over the first fin structure, the second fin structure, and the third fin structure. As a result, a merged semiconductor element is formed on the first fin structure and the second fin structure, and an isolated semiconductor element is formed on the third fin structure.

In accordance with some embodiments, a method for forming a semiconductor device structure us provided. The method includes forming a first fin structure, a second fin structure, and a third fin structure over a semiconductor substrate. The method also includes forming spacer elements over sidewalls of the third fin structure. The method further includes recessing the third fin structure and recessing the first fin structure and the second fin structure such that top surfaces of the first fin structure and the second fin structure are lower than a top surface of the third fin structure. In addition, the method includes epitaxially growing a semiconductor material over the first fin structure, the second fin structure, and the third fin structure after the first fin structure, the second fin structure, and the third fin structure are recessed. As a result, a merged semiconductor element is formed on the first fin structure and the second fin structure, and an isolated semiconductor element is formed on the third fin structure.

In accordance with some embodiments, a semiconductor device structure is provided. The semiconductor device structure includes a first fin structure, a second fin structure, and a third fin structure over a semiconductor substrate. The semiconductor device structure also includes first spacer elements over sidewalls of the first fin structure and sidewalls of the second fin structure. The semiconductor device structure further includes second spacer elements over sidewalls of the third fin structure. Each of the second spacer elements is taller than each of the first spacer elements. In addition, the semiconductor device structure includes a merged semiconductor element on the first fin structure and the second fin structure. The semiconductor device structure also includes an isolated semiconductor element on the third fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a first fin structure, a second fin structure, and a third fin structure over a semiconductor substrate;
    forming first spacer elements over sidewalls of the first fin structure and sidewalls of the second fin structure;
    partially removing the first fin structure and the second fin structure after the formation of the first spacer elements;
    forming second spacer elements over sidewalls of the third fin structure, wherein each of the second spacer elements is taller than each of the first spacer elements, and the second spacer elements are formed before the first spacer elements;
    partially removing the third fin structure after the formation of the second spacer elements; and
    after the first fin structure, the second fin structure, and the third fin structure are partially removed, epitaxially growing a semiconductor material over the first fin structure, the second fin structure, and the third fin structure such that a merged semiconductor element is formed on the first fin structure and the second fin structure, and an isolated semiconductor element is formed on the third fin structure.

2. The method for forming a semiconductor device structure as claimed in claim 1, wherein forming the first spacer elements and the second spacer elements comprises:
    forming a spacer layer over the first fin structure, the second fin structure, and the third fin structure;
    removing a first portion of the spacer layer, wherein a first remaining portion of the spacer layer forms the first spacer elements; and
    removing a second portion of the spacer layer, wherein a second remaining portion of the spacer layer forms the second spacer elements.

3. The method for forming a semiconductor device structure as claimed in claim 2, wherein forming the first spacer elements and the second spacer elements further comprises:
    forming a first mask element to cover a first part of the spacer layer over the first fin structure and the second fin structure before removing the second portion of the spacer layer;
    removing the first mask element after the second spacer elements are formed;
    forming a second mask element to cover the second spacer elements and the third fin structure; and
    removing the second mask element after the first spacer elements are formed.

4. The method for forming a semiconductor device structure as claimed in claim 1, wherein forming the first spacer elements and the second spacer elements comprises:
    forming a spacer layer over the first fin structure, the second fin structure, and the third spacer layer;
    partially removing the spacer layer such that a first remaining portion of the spacer layer forms the second spacer elements, and a second remaining portion of the spacer layer forms third spacer elements over the sidewalls of the first fin structure and the second fin structure;
    forming a mask element to cover the second spacer elements and the third fin structure; and
    partially removing the third spacer elements after the mask element is formed, wherein a third remaining portion of the third spacer elements form the first spacer elements.

5. The method for forming a semiconductor device structure as claimed in claim 1, wherein epitaxially growing the semiconductor material comprises:
    using a first semiconductor-containing gas to epitaxially grow an inner portion of the merged semiconductor element and an inner portion of the isolated semiconductor element; and
    using a second semiconductor-containing gas to epitaxially grow an outer portion of the merged semiconductor element and an outer portion of the isolated semiconductor element, wherein the second semiconductor-containing gas has a greater dopant concentration than that of the first semiconductor-containing gas.

6. The method for forming a semiconductor device structure as claimed in claim 5, wherein the outer portion of the merged semiconductor element is larger than the outer portion of the isolated semiconductor element.

7. The method for forming a semiconductor device structure as claimed in claim 1, wherein the merged semiconductor element and the isolated semiconductor element are simultaneously formed.

8. The method for forming a semiconductor device structure as claimed in claim 1, further comprising forming an isolation feature to surround lower portions of the first fin structure, the second fin structure, and the third fin structure, wherein:
   after partially removing the first fin structure and the second fin structure, top surfaces of the first fin structure and the second fin structure are below a top surface of the isolation feature, and
   after partially removing the third fin structure, a top surface of the third fin structure is above the top surface of the isolation feature.

9. The method for forming a semiconductor device structure as claimed in claim 1, further comprising:
   forming a first gate stack partially covering the first fin structure and the second fin structure before the first spacer elements and the second spacer elements are formed; and
   forming a second gate stack partially covering the third fin structure before the first spacer elements and the second spacer elements are formed.

10. A method for forming a semiconductor device structure, comprising:
   forming a first fin structure, a second fin structure, and a third fin structure over a semiconductor substrate;
   forming spacer elements over sidewalls of the third fin structure;
   recessing the third fin structure;
   recessing the first fin structure and the second fin structure such that top surfaces of the first fin structure and the second fin structure are lower than a top surface of the third fin structure; and
   after the first fin structure, the second fin structure, and the third fin structure are recessed, epitaxially growing a semiconductor material over the first fin structure, the second fin structure, and the third fin structure such that a merged semiconductor element is formed on the first fin structure and the second fin structure, and an isolated semiconductor element is formed on the third fin structure, wherein the epitaxially growing of the semiconductor material comprises:
      using a first semiconductor-containing gas to epitaxially grow an inner portion of the merged semiconductor element and an inner portion of the isolated semiconductor element; and
      using a second semiconductor-containing gas to epitaxially grow an outer portion of the merged semiconductor element and an outer portion of the isolated semiconductor element, wherein the second semiconductor-containing gas has a greater dopant concentration than that of the first semiconductor-containing gas.

11. The method for forming a semiconductor device structure as claimed in claim 10, wherein forming the spacer elements comprises:
   forming a spacer layer over the first fin structure, the second fin structure, and the third fin structure; and
   removing a portion of the spacer layer over the sidewalls of the third fin structure such that a remaining portion of the spacer layer over the sidewalls of the third fin structure forms the spacer elements.

12. The method for forming a semiconductor device structure as claimed in claim 11, further comprising:
   forming a first mask element to cover a first part of the spacer layer over the first fin structure and the second fin structure;
   removing the first mask element after the spacer elements are formed;
   forming a second mask element to cover the spacer elements and the third fin structure;
   removing at least a portion of the spacer layer over the sidewalls of the first fin structure and the second fin structure after the second mask element is formed; and
   removing the second mask element.

13. The method for forming a semiconductor device structure as claimed in claim 12, wherein the spacer layer over the sidewalls of the first fin structure and the second fin structure are completely removed.

14. The method for forming a semiconductor device structure as claimed in claim 12, wherein the spacer layer over the sidewalls of the first fin structure and the second fin structure are partially removed.

15. A method for forming a semiconductor device structure, comprising:
   forming a first fin structure and a second fin structure over a semiconductor substrate;
   forming a spacer layer over a sidewall of the first fin structure and a sidewall of the second fin structure;
   partially removing the spacer layer to form a first spacer element over the sidewall of the second fin structure;
   recessing the second fin structure;
   partially removing the spacer layer to form a second spacer element over the sidewall of the first fin structure;
   recessing the first fin structure after the second fin structure is recessed such that the second fin structure is taller than the first fin structure; and
   epitaxially growing a semiconductor material over the first fin structure and the second fin structure to respectively form a first semiconductor element and a second semiconductor element over the first fin structure and the second fin structure after recessing the second fin structure.

16. The method for forming a semiconductor device structure as claimed in claim 15, wherein after recessing the first fin structure, the first spacer element is taller than the second spacer element.

17. The method for forming a semiconductor device structure as claimed in claim 16, wherein the first spacer element is formed before the second spacer element.

18. The method for forming a semiconductor device structure as claimed in claim 15, further comprising forming an isolation feature to surround lower portions of the first fin structure and the second fin structure, wherein:
   after recessing the second fin structure, a top surface of the second fin structure is above a top surface of the isolation feature, and
   after recessing the first fin structure, a top surface of the first fin structure is below the top surface of the isolation feature.

19. The method for forming a semiconductor device structure as claimed in claim 15, wherein epitaxially growing the semiconductor material comprises:
   using a first semiconductor-containing gas to epitaxially grow an inner portion of the first semiconductor element and an inner portion of the second semiconductor element; and
   using a second semiconductor-containing gas to epitaxially grow an outer portion of the first semiconductor element and an outer portion of the second semiconductor element, wherein the second semiconductor-containing gas has a greater dopant concentration than that of the first semiconductor-containing gas.

20. The method for forming a semiconductor device structure as claimed in claim 19, wherein the outer portion of the first semiconductor element is larger than the outer portion of the second semiconductor element.

* * * * *